United States Patent
Shimizu et al.

(10) Patent No.: US 9,252,254 B2
(45) Date of Patent: Feb. 2, 2016

(54) SEMICONDUCTOR DEVICE AND METHOD OF MANUFACTURING THE SAME, AND POWER SUPPLY APPARATUS

(71) Applicant: FUJITSU LIMITED, Kawasaki-shi, Kanagawa (JP)

(72) Inventors: Sanae Shimizu, Atsugi (JP); Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 335 days.

(21) Appl. No.: 13/655,673

(22) Filed: Oct. 19, 2012

(65) Prior Publication Data

US 2013/0077352 A1   Mar. 28, 2013

Related U.S. Application Data

(63) Continuation of application No. PCT/JP2010/057140, filed on Apr. 22, 2010.

(51) Int. Cl.
| | |
|---|---|
| *H01L 29/778* | (2006.01) |
| *H01L 29/423* | (2006.01) |
| *H01L 29/66* | (2006.01) |
| *H01L 29/20* | (2006.01) |
| *H01L 29/51* | (2006.01) |

(52) U.S. Cl.
CPC ...... *H01L 29/7787* (2013.01); *H01L 29/42316* (2013.01); *H01L 29/66462* (2013.01); *H01L 29/7781* (2013.01); *H01L 29/2003* (2013.01); *H01L 29/518* (2013.01)

(58) Field of Classification Search
CPC .......... H01L 29/2003; H01L 29/7787

USPC .............. 438/191; 247/192; 257/192
See application file for complete search history.

(56) References Cited

U.S. PATENT DOCUMENTS

| | | | |
|---|---|---|---|
| 6,426,270 | B1 | 7/2002 | Sakaguchi |
| 2006/0054929 | A1 | 3/2006 | Nakayama |
| 2007/0272969 | A1 | 11/2007 | Teraguchi |
| 2008/0067546 | A1* | 3/2008 | Murata ......... H01L 23/367 257/192 |
| 2010/0276732 | A1 | 11/2010 | Ando | |

FOREIGN PATENT DOCUMENTS

| | | |
|---|---|---|
| JP | 2000-223682 | 8/2000 |
| JP | 2004-6461 A1 | 1/2004 |
| JP | 2006-261179 A1 | 9/2006 |
| JP | 2006-313837 A1 | 11/2006 |
| JP | 2007-109830 A1 | 4/2007 |
| JP | 2007-207820 A1 | 8/2007 |
| JP | 2007-317729 A1 | 12/2007 |

(Continued)

OTHER PUBLICATIONS

Written Opinion from PCT/JP2010/057140.*

(Continued)

*Primary Examiner* — Thomas L Dickey
(74) *Attorney, Agent, or Firm* — Kratz, Quintos & Hanson, LLP

(57) ABSTRACT

A semiconductor device includes a substrate; a first nitride semiconductor layer provided over the substrate and having a nitride-polar surface; a gate electrode provided over the first nitride semiconductor layer; and a semiconductor layer provided on the first nitride semiconductor layer and only under the gate electrode, and exhibiting a polarization.

19 Claims, 10 Drawing Sheets

(56) References Cited

FOREIGN PATENT DOCUMENTS

| JP | 2008-26901 | A1 | 2/2008 |
| JP | 2008-103705 | A1 | 5/2008 |
| JP | 2008-244419 | A1 | 10/2008 |
| JP | 2008-258310 | A1 | 10/2008 |
| WO | WO 2009/081584 | A1 | 7/2009 |

OTHER PUBLICATIONS

International Search Report for International Application No. PCT/JP2010/057140 dated Jul. 27, 2010.

* cited by examiner

SEMICONDUCTOR DEVICE AND METHOD OF MANUFACTURING THE SAME, AND POWER SUPPLY APPARATUS

CROSS-REFERENCE TO RELATED APPLICATION

This application is a continuation application of a international application PCT/JP2010/057140 filed on Apr. 22, 2010 and designated the U.S., the entire contents of which are incorporated herein by reference.

FIELD

The present disclosure relates to a semiconductor device and a method of manufacturing the same, and a power supply apparatus.

BACKGROUND

Nitride semiconductor devices are characteristic in terms of their higher saturation electron velocities and wider band gaps. Efforts for developing devices with higher withstanding voltages and higher outputs by exploiting such characteristics have been made actively.

Particularly, one type of nitride semiconductor devices used for such devices with higher withstanding voltages and higher outputs is a high electron mobility transistor (HEMT).

For example, an AlGaN/GaN-HEMT has been developed, which has a HEMT structure wherein GaN is employed as an electron transit layer, AlGaN is employed as an electron supply layer, and an AlGaN layer is staked on a GaN layer. In an AlGaN/GaN-HEMT, strain is generated in AlGaN due to the difference in the lattice constants of AlGaN and GaN, which induces piezo polarization. High density two-dimensional electron gas (2DEG) is generated by the piezo polarization and the spontaneous polarization of AlGaN. In this manner, an AlGaN/GaN-HEMT can provide a device with a higher withstanding voltage and a higher output.

Such an AlGaN/GaN-HEMT, however, exhibits higher contact resistances of a source electrode and a drain electrode, due to the HEMT structure stacking an AlGaN layer on a GaN layer.

Against such a background, an AlGaN/GaN-HEMT with reduced contact resistances has been proposed, which has an inverted HEMT structure having a nitride-polar surface and a GaN layer stacked on an AlGaN layer.

SUMMARY

Accordingly, a semiconductor device includes: a substrate; a first nitride semiconductor layer provided over the substrate and having a nitride-polar surface; a gate electrode provided over the first nitride semiconductor layer; and a semiconductor layer provided on the first nitride semiconductor layer and only under the gate electrode, and exhibiting a polarization.

Further, a power supply apparatus includes: voltage converter; and a higher-voltage circuit and a lower-voltage circuit provided on opposite sides of the voltage converter, sandwiching the voltage converter therebetween, wherein the higher-voltage circuit includes a transistor, and the transistor includes: a substrate; a first nitride semiconductor layer provided over the substrate and having a nitride-polar surface; a gate electrode provided over the first nitride semiconductor layer; and a semiconductor layer provided on the first nitride semiconductor layer and only under the gate electrode, and exhibiting a polarization.

Further, a method of manufacturing a semiconductor device, includes: forming a first nitride semiconductor layer with a nitride-polar surface, over a substrate; forming a semiconductor layer exhibiting a polarization, in a region where a gate electrode is to be formed on the first nitride semiconductor layer; and forming a gate electrode over the semiconductor layer.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

A development of normally-off type transistors is still problematic, however, even with an inverted HEMT structure as described above, since the two-dimensional electron gas is present in a higher density in an AlGaN/GaN-HEMT.

Not only an AlGaN/GaN-HEMT having an inverted HEMT structure as described above, but a semiconductor device including a nitride semiconductor layer with a nitride-polar surface and further including a gate electrode also experiences the similar challenge in achieving a higher withstanding voltage and a higher output, as well as reducing the contact resistance.

Hence, there exists a need to achieve a normally-off operation while achieving a higher withstanding voltage and a higher output, as well as reducing the contact resistances.

Hereinafter, a semiconductor device and a method of manufacturing the same, and a power supply apparatus in accordance with embodiments will be described with reference to the drawings.

[First Embodiment]

A semiconductor device and a method of manufacturing the same in accordance with a first embodiment will be described with reference to FIGS. 1-4B.

The semiconductor device in accordance with the present embodiment is a device with a higher withstanding voltage and a higher output, wherein a nitride semiconductor material is employed. Such a semiconductor device is also referred to as a nitride semiconductor device.

This semiconductor device further includes a field-effect transistor wherein a nitride semiconductor material is employed. Such a semiconductor device is also referred to as a nitride semiconductor field effect transistor.

Particularly, this semiconductor device includes a HEMT. Further, this HEMT includes an inverted HEMT structure including a nitride semiconductor layer with a nitride-polar surface. Note that a HEMT is also referred to as a semiconductor element.

Figure 1:
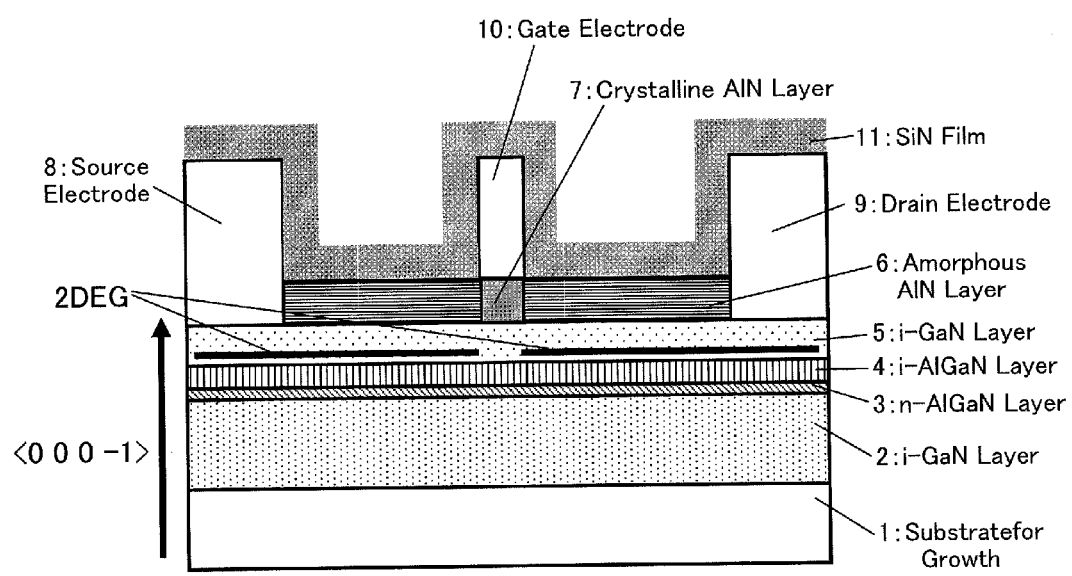
FIG. 1 is a schematic cross-sectional view illustrating the configuration of a semiconductor device in accordance with a first embodiment.

More specifically, this semiconductor device includes, a substrate 1, a nitride semiconductor layer 5 (first nitride semiconductor layer) provided over the substrate 1 and having a nitride-polar (N-polar) surface, and a gate electrode 10 provided over the nitride semiconductor layer 5, as depicted in FIG. 1. In this manner, provision of the nitride semiconductor layer 5 can achieve a higher withstanding voltage and a higher output. Provision of the inverted HEMT structure including the nitride semiconductor layer 5 with the nitride-polar surface can help to reduce the contact resistance.

Particularly, in the present embodiment, a semiconductor layer 7 exhibiting a polarization is provided on the first nitride semiconductor layer 5 and only under the gate electrode 10. This can help to achieve a normally-off operation.

Specifically, this semiconductor device includes a GaN-HEMT wherein a GaN-based semiconductor material is employed. Such a semiconductor device is also referred to as a GaN-based electronic device. Particularly, this GaN-HEMT includes an inverted HEMT structure including a GaN layer 5 terminated with N (nitride) and having a nitride-polar surface, i.e., a surface having an N-face (N-polar face, nitride face).

Hereinafter, an AlGaN/GaN-HEMT including an inverted HEMT structure will be described as an example of the semiconductor device.

As depicted in FIG. 1, this AlGaN/GaN-HEMT has a structure (nitride semiconductor stacked structure) where an i-GaN layer 2, an n-AlGaN layer 3, an i-AlGaN layer 4, and an i-GaN layer 5 are stacked, in this order, over a sapphire substrate 1, as a substrate for growth, such that the surface of each of the layers has a nitride-polarity, here, in the <000-1> direction. In other words, this AlGaN/GaN-HEMT includes an inverted HEMT structure with a nitride-polar surface, wherein the GaN layer 5 is stacked on the AlGaN layer 4.

In this embodiment, the n-AlGaN layer 3 is an electron supply layer, whereas the i-GaN layer 5 is an electron transit layer. As an intermediate layer, the i-AlGaN layer 4 is provided between the n-AlGaN electron supply layer 3 and the i-GaN electron transit layer 5. In this structure, two-dimensional electron gas (2DEG) is generated in the i-GaN electron transit layer 5 in the vicinity of the interface with the n-AlGaN electron supply layer 3 (the interface with the i-AlGaN intermediate layer 4, to be exact). Note that the GaN layer 5 is a nitride semiconductor layer with a nitride-polar surface, and is also referred to as a first nitride semiconductor layer. The AlGaN layer constructed from the n-AlGaN layer 3 and the i-AlGaN layer 4 contacts the bottom (lower surface) of the first nitride semiconductor layer 5 and is a nitride semiconductor layer with a nitride-polar surface, and is also referred to as a second nitride semiconductor layer.

In this manner, since this AlGaN/GaN-HEMT has an inverted HEMT structure, it exhibits spontaneous polarizations of different directions which are opposite from each other. This can help to reduce the contact resistance.

A source electrode 8, a drain electrode 9, and a gate electrode 10 are provided over the inverted HEMT structure (compound semiconductor stacked structure) configured as described above.

More specifically, this AlGaN/GaN-HEMT includes the source electrode 8 and the drain electrode 9 on the i-GaN layer 5.

Further, this AlGaN/GaN-HEMT includes the gate electrode 10 over the i-GaN layer 5, having an AlN layer 7 in a crystalline state interposed therebetween. In other words, the AlN layer 7 in a crystalline state is provided on the i-GaN layer 5 and only under the gate electrode 10. In this embodiment, the AlN layer 7 in a crystalline state is a monocrystalline AlN layer. Note that the AlN layer 7 in a crystalline state is also referred to as a crystalline AlN layer, a nitride semiconductor crystalline layer, or a semiconductor layer.

In this manner, the AlN layer 7 in a crystalline state is provided in the region only directly under the gate electrode 10 on the i-GaN layer 5 with the nitride-polar surface.

Here, the AlN layer 7 in a crystalline state contacts the surface of the i-GaN layer 5, has a wider band gap and a greater polarization than the i-GaN layer 5, and has a desired thickness. Hence, generation of two-dimensional electron gas in a higher density (high density carriers) is suppressed in the region directly under the gate electrode 10.

Figure 2A:
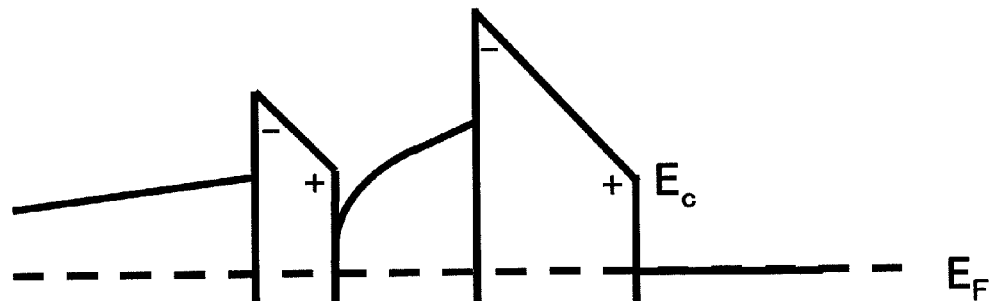
FIG. 2A is an energy band diagram of the semiconductor device in accordance with the first embodiment in a region where an AlN layer in a crystalline state is provided directly under a gate electrode.
Figure 2B:
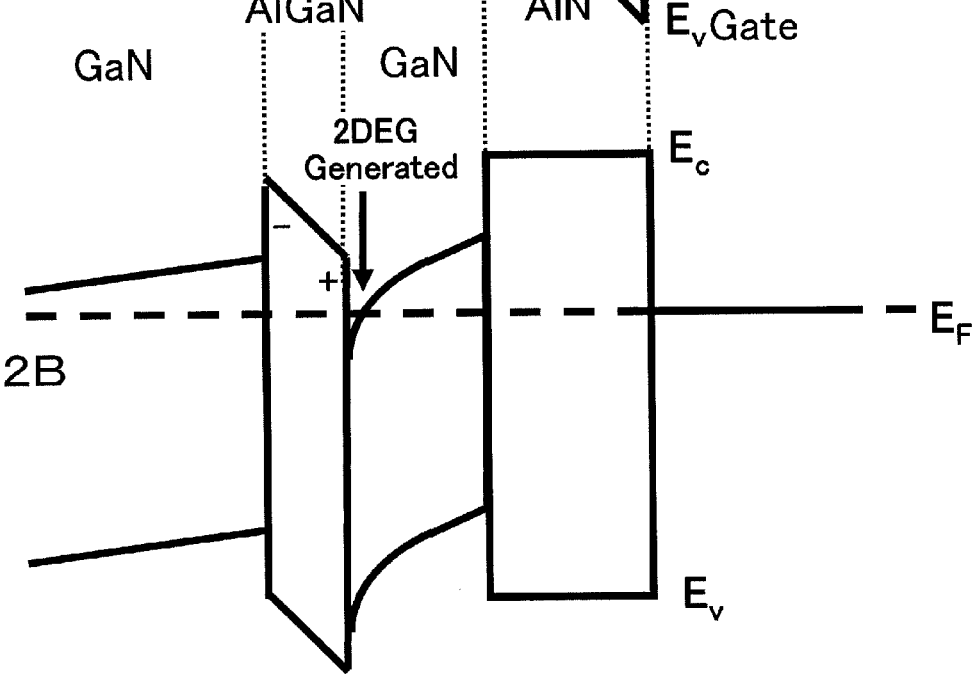
FIG. 2B is an energy band diagram of the semiconductor device in accordance with the first embodiment in a region where an AlN layer in an amorphous state is provided other than the region directly under a gate electrode.

In other words, in the AlGaN/GaN-HEMI, the energy level $E_C$ of the conduction band of the i-GaN electron transit layer 5 in the interface with the n-AlGaN electron supply layer 3 (the interface with the i-AlGaN intermediate layer 4, to be exact) becomes lower than the Fermi level $E_F$, and two-dimensional electron gas is generated in a higher density (refer to FIG. 2B). Some current flows due to the high density two-dimensional electron gas even in the absence of application of a gate voltage, which hinders realization of a normally-off operation. In other words, the gate threshold voltage assumes a negative value, smaller than 0 V.

For this reason, the AlN layer 7 in a crystalline state is provided in the region only directly under the gate electrode 10 on the i-GaN layer 5, as depicted in FIG. 1. Since the AlN layer 7 provided in the region directly under the gate electrode 10 is in a crystalline state, as depicted in FIG. 2A, polarizations (spontaneous polarization and piezo polarization) are induced. The polarizations in the AlN layer 7 in a crystalline state raise the energy level $E_C$ of the conduction band of the AlN layer 7 on the side of the i-GaN layer 5. This results in an increased energy level $E_C$ of the conduction band of the i-GaN layer 5, and the energy level $E_C$ of the conduction band of the i-GaN layer 5 at the interface with the AlGaN layer 4 exceeds the Fermi level $E_F$, which suppresses generation of high density two-dimensional electron gas. This can help to achieve a normally-off operation. In other words, only by providing the AlN layer 7 in a crystalline state in the region directly under the gate electrode 10, i.e., substantially without modifying a design of a transistor, a normally-off type transistor can be achieved.

In this embodiment, the AlN layer 7 in a crystalline state has a strength of a polarization and thickness suitable for raising the gate threshold voltage to 0 V or higher.

Here, the strength of the spontaneous polarization of AlN in a crystalline state (strength of the internal electric field) is about 8.5 MV/cm.

An AlGaN/GaN-HEMT without the AlN layer 7 in a crystalline state in the region directly under the gate electrode 10 would have a gate threshold voltage of about −4 V.

Hence, the AlN layer 7 in a crystalline state with a thickness of about 5 nm or more can raise the gate threshold voltage to 0 V or higher, thereby achieving a normally-off operation. Although only the strength of spontaneous polarization in the AlN layer 7 in a crystalline state is considered to determine the thickness of the AlN layer 7 in a crystalline state here, piezo polarization is also induced in the AlN layer 7 in a crystalline state. Hence, in reality, the strength of piezo polarization in the AlN layer 7 in a crystalline state is also considered to determine the thickness of the AlN layer 7 in a crystalline state.

As depicted in FIG. 1, the surface of the i-GaN layer 5 other than the region directly under the gate electrode 10 is covered with an AlN layer 6 in an amorphous state. In other words, an AlN layer 6 in an amorphous state (amorphous layer) is provided so as to cover the surface of the i-GaN layer 5, other than the region directly under the gate electrode 10, the region directly under the source electrode 8, and the region directly under the drain electrode 9. Note that the AlN layer 6 in an amorphous state is also referred to as an amorphous AlN layer. Hence, since the AlN layer 6 provided in the region other than the region directly under the gate electrode 10 on the i-GaN layer 5 with the nitride-polar surface is in an amorphous state, no polarization is induced, as depicted in FIG. 2B. Accordingly, the energy level $E_C$ of the conduction band of the i-GaN layer 5 at the interface with the AlGaN layer 4 remains lower than the Fermi level $E_F$. As a result, high density two-dimensional electron gas is present in the region other than the region directly under the gate electrode 10. This helps to achieve a higher output.

As described above, in this AlGaN/GaN-HEMT, the AlN layers 6 and 7 formed on the i-GaN layer 5 is in a crystalline state in the region directly under the gate electrode 10, while being in an amorphous state in the other region. That is, the semiconductor layer 7 provided in the region directly under the gate electrode 10 on the i-GaN layer 5, and the amorphous layer 6 provided in the region other than the region directly under the gate electrode 10 include the same semiconductor material.

The entire surface of this AlGaN/GaN-HEMT is covered with an SiN passivation film 11.

Next, a method of manufacturing this AlGaN/GaN-HEMT (semiconductor device) will be explained with reference to FIGS. 3A to 4B.

Figure 3A:
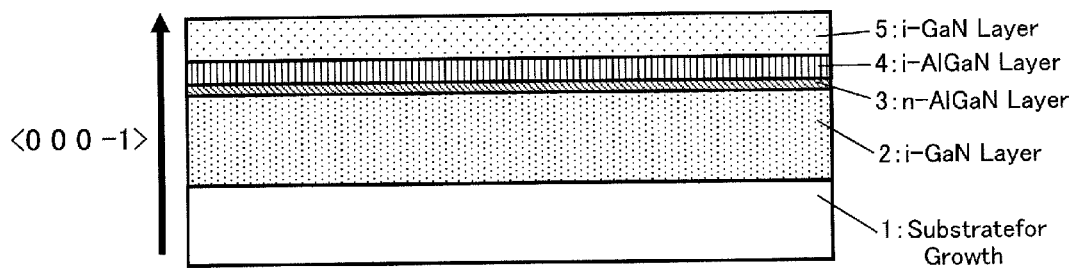
FIGS. 3A to 3C are schematic cross-sectional views illustrating a method of manufacturing the semiconductor device in accordance with the first embodiment.

Firstly, as depicted in FIG. 3A, an inverted HEMT structure including a GaN layer 5 with a nitride-polar surface is formed with a metal organic chemical vapor deposition (MOCVD), for example, on a sapphire substrate 1 as a substrate for growth.

Specifically, the i-GaN layer 2 is formed such that its surface has a nitride polarity. In this example, the i-GaN layer 2 has a thickness of about 2 μm, for example.

Subsequently, an n-AlGaN layer 3, an 1-AlGaN layer 4, and an i-GaN layer 5 are sequentially stacked over the i-GaN layer 2 with the nitride-polar surface, to form a nitride semiconductor stack structure. In this case, the surface of each of the n-AlGaN layer 3, the i-AlGaN layer 4, and the i-GaN layer 5 has a nitride-polarity.

Here, the n-AlGaN layer 3 has a thickness of about 30 nm, and an Al ratio of about 0.2, for example. Further, Si is used as n-type impurities, for example, and the dope level (impurity concentration) is about $1 \times 10^{18}$ cm$^{-3}$ to about $1 \times 10^{20}$ cm$^{-3}$, for example, and about $5 \times 10^{18}$ cm$^{-3}$ in this example. Further, the i-AlGaN layer 4 has a thickness of about 5 nm, and an Al ratio of about 0.2, for example. Further, the i-GaN layer 5 has a thickness of about 10 nm, for example.

In this manner, the inverted HEMT structure including the i-GaN layer 5 with the nitride-polar surface is formed.

Figure 3B:
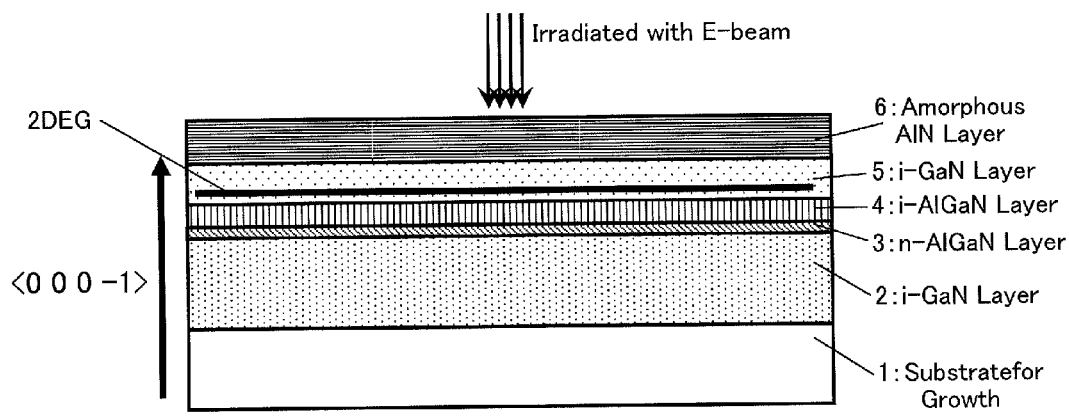
Figure 3C:
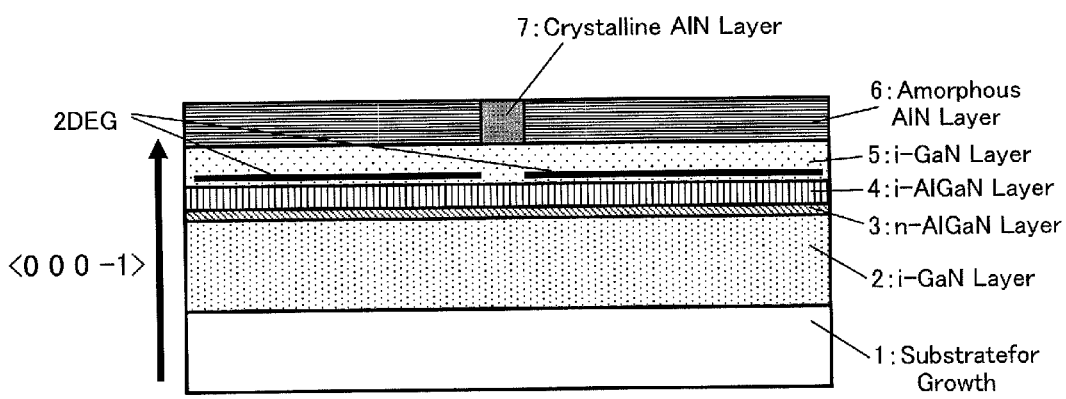

Next, as depicted in FIGS. 3B and 3C, an AlN layer 7 in a crystalline state is formed in the region directly under the gate electrode 10 on the i-GaN layer 5 with the nitride-polar surface using MOCVD, for example, and an AlN layer 6 in an amorphous state is formed so as to cover the surface of the i-GaN layer 5.

More specifically, as depicted in FIG. 3B, the AlN layer 6 in an amorphous state is formed over the entire surface of the i-GaN layer 5 by adjusting the film formation condition. Here, the AlN layer 6 in an amorphous state has a thickness of 10 nm, for example.

Subsequently, as depicted in FIG. 3B, the AlN layer 6 in an amorphous state formed on the i-GaN layer 5 in a region where a gate electrode is to be formed, is irradiated with electron beam, for example. Thereby, as depicted in FIG. 3C, the AlN layer 6 in an amorphous state formed on the i-GaN layer 5 in a region where a gate electrode is to be formed, is crystallized to form an AlN layer 7 in a crystalline state in the region where a gate electrode is to be formed.

Figure 4A:
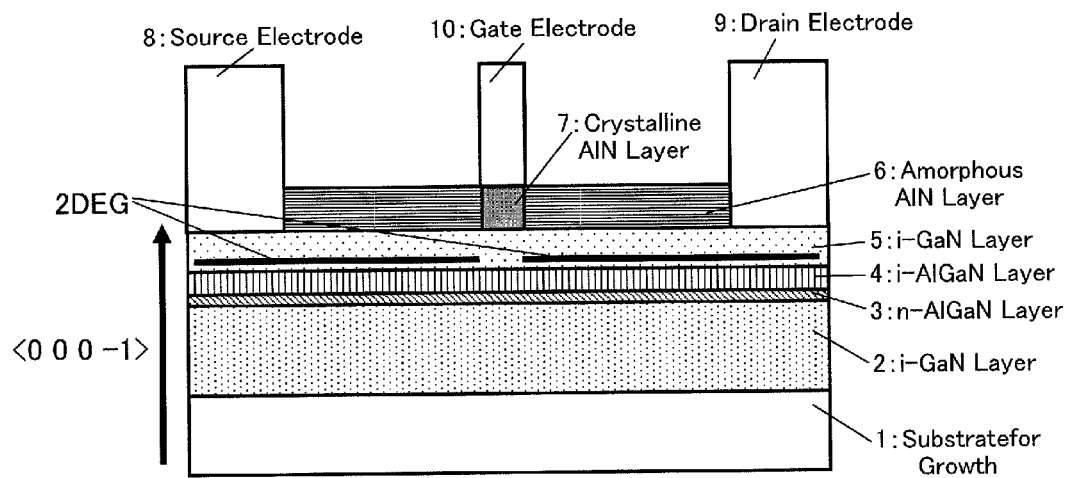
FIGS. 4A and 4B are schematic cross-sectional views illustrating the method of manufacturing the semiconductor device in accordance with the first embodiment.

Next, as depicted in FIG. 4A, the AlN layer 6 in an amorphous state on the i-GaN layer 5 in the region where a source electrode is to be formed and the region where a drain electrode is to be formed, is removed to expose the i-GaN layer 5 with lithography technique, for example.

A source electrode 8 and a drain electrode 9 made of Ti/Al, for example, are then formed with evaporation and lift-off techniques, for example, on the i-GaN layer 5 in the region where a source electrode is to be formed and the region where a drain electrode is to be formed.

Thereafter, an ohmic contact is established in an annealing process in a temperature of about 600° C., for example, in a nitride atmosphere, for example.

Next, a gate electrode 10 made of Ni/Au, for example, is formed on the AlN layer 7 in a crystalline state in the region where a gate electrode is to be formed, with photolithography, and evaporation and lift-off techniques, for example.

Figure 4B:
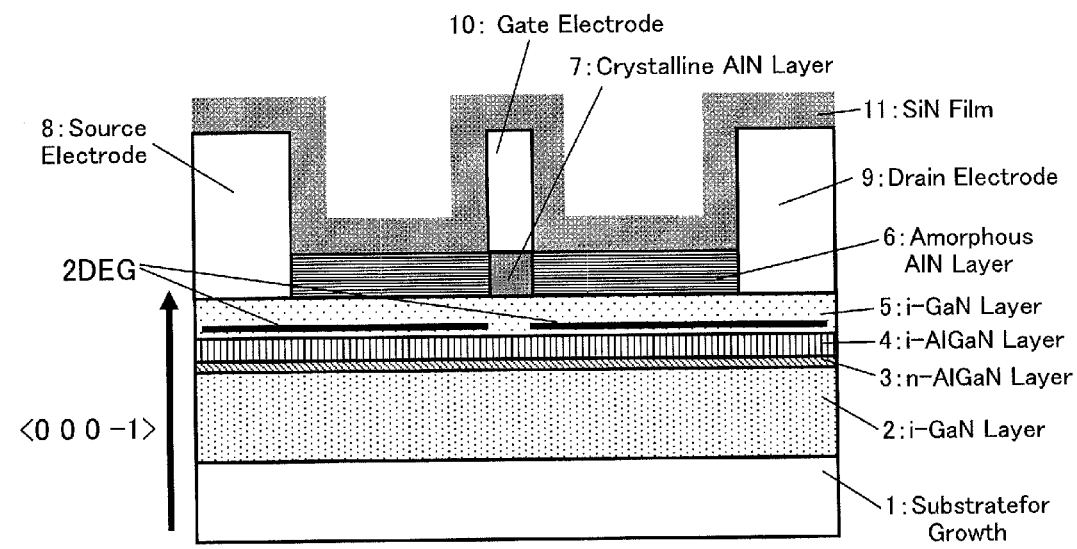

Subsequently, as depicted in FIG. 4B, an SiN passivation film 11 is formed over the entire surface, with a plasma-enhanced chemical vapor deposition (plasma CVD, PECVD), for example.

Thereafter, interconnections for electrodes, i.e., the source electrode 8, the drain electrode 9, and the gate electrode 10, are formed to complete the AlGaN/GaN-HEMT (semiconductor device).

As described above, the semiconductor device and the method of the manufacturing the same in accordance with the present embodiment are advantageous in that a higher withstanding voltage and a higher output are achieved, as well as achieving a normally-off operation while reducing the contact resistance.

Particularly, in accordance with the method of manufacturing a semiconductor device of the present embodiment, a device capable of operating in a normally-off operation can be fabricated, without requiring any special processes. More specifically, a device capable of operating in a normally-off operation can be fabricated in a lower cost, since substantially no modification to conventional processes is required.

[Second Embodiment]

Next, a semiconductor device and a method of manufacturing the same in accordance with a second embodiment will be described with reference to FIGS. 5 and 6A-6C.

Figure 5:
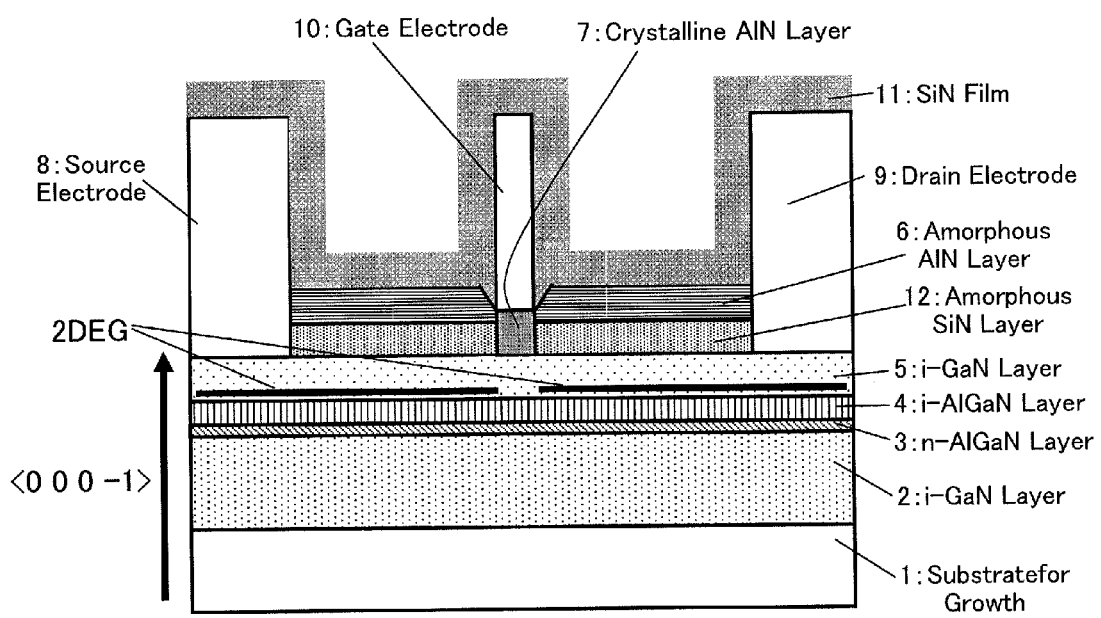
FIG. 5 is a schematic cross-sectional view illustrating the configuration of a semiconductor device in accordance with a second embodiment.

A semiconductor device (AlGaN/GaN-HEMT) in accordance with the present embodiment is different from that in the above-described first embodiment in that an amorphous layer covering the surface of the inverted HEMT has a dual-layered structure, as depicted in FIG. 5. In FIG. 5, the same elements as those in the above-described first embodiment are referenced to by the like reference symbols.

More specifically, in this AlGaN/GaN-HEMT, the surface of an i-GaN layer 5 other than the region directly under a gate electrode 10 is covered with an SiN layer 12 in an amorphous state. In other words, an SiN layer 12 (first amorphous layer) in an amorphous state is provided so as to cover the surface of the i-GaN layer 5, other than the region directly under the gate electrode 10, the region directly under the source electrode 8, and the region directly under the drain electrode 9. Note that the SiN layer 12 in an amorphous state is also referred to as an amorphous SiN layer.

Further, the surface of the SiN layer 12 in an amorphous state is covered with an AlN layer 6 in an amorphous state (second amorphous layer). In other words, the AlN layer 6 in an amorphous state is provided on the SiN layer 12 in an amorphous state.

As described above, the present embodiment has a structure where the SiN layer 12 in an amorphous state and the AlN layer 6 in an amorphous state are sequentially stacked over the i-GaN layer 5 other than the region directly under the gate electrode 10. In other words, the present embodiment has a structure where a first amorphous layer and a second amorphous layer including different materials are stacked.

In such a case, since the SiN layer 12 and the AlN layer 6 provided in the region, on the i-GaN layer 5 with the nitride-polar surface, other than the region directly under the gate electrode 10 are in an amorphous state, no polarization is induced. Accordingly, the energy level $E_C$ of the conduction band of the i-GaN layer 5 at the interface with the AlGaN layer 4 remains lower than the Fermi level $E_F$ (refer to FIG. 2B). As a result, high density two-dimensional electron gas remains present in the region other than the region directly under the gate electrode 10. This helps to achieve a higher output.

As described above, in this AlGaN/GaN-HEMT, the AlN layers 6 and 7 covering the i-GaN layer 5 is in a crystalline state in the region directly under the gate electrode 10, while being in an amorphous state in the other region. That is, the semiconductor layer 7 provided in the region directly under the gate electrode 10 on the i-GaN layer 5, and the second amorphous layer 6 provided in the region other than the region directly under the gate electrode 10 include the same semiconductor material.

Figure 6A:
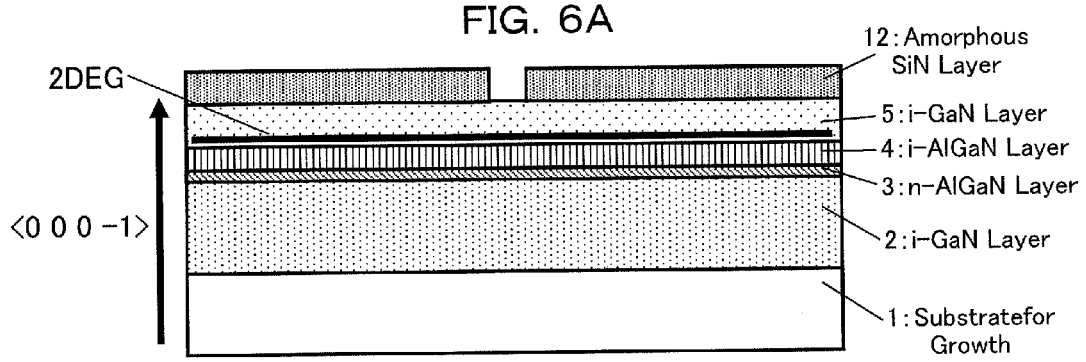
FIGS. 6A to 6C are schematic cross-sectional views illustrating a method of manufacturing the semiconductor device in accordance with the second embodiment.
Figure 6B:
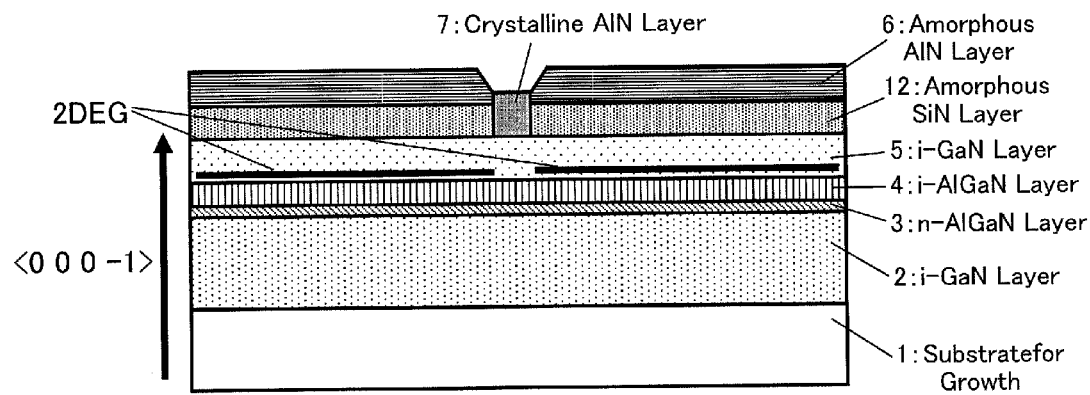
Figure 6C:
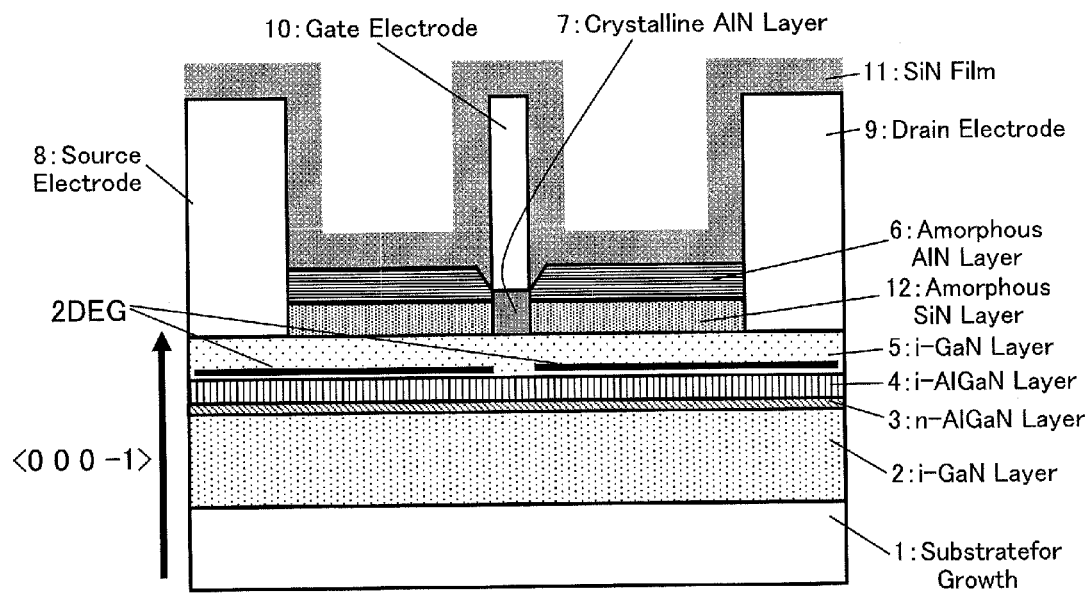

Next, a method of manufacturing this AlGaN/GaN-HEMT (semiconductor device) will be explained with reference to FIGS. 6A-6C. In FIGS. 6A-6C, the same elements as those in the above-described first embodiment are referenced to by the like reference symbols.

Firstly, in the manner similar to the above-described first embodiment, as depicted in FIG. 6A, an inverted HEMT structure including a GaN layer 5 with a nitride-polar surface is formed with an MOCVD, for example, on a sapphire substrate 1 as a substrate for growth.

Next, as depicted in FIGS. 6A to 6C, an AlN layer 7 in a crystalline state is formed in the region directly under the gate electrode 10 on the i-GaN layer 5 with the nitride-polar surface using MOCVD, for example, and an SiN layer 12 in an amorphous state and an AlN layer 6 in an amorphous state are formed so as to cover the surface of the i-GaN layer 5.

More specifically, firstly as depicted in FIG. 6A, a mask (not illustrate) is formed on the i-GaN layer 5 in the region where a gate electrode is to be formed, with photolithography technique, for example, followed by formation of an SiN layer 12 in an amorphous state over the entire surface.

Subsequently, after removing the mask, an AlN layer is formed over the entire surface, and an annealing process at about 1000° C., for example, is then performed. In this case, as depicted in FIG. 6B, the AlN layer formed on the SiN layer 12 in an amorphous state is converted to an AlN layer 6 in an amorphous state, while the AlN layer formed on the i-GaN layer 5 is converted to an AlN layer 7 in a crystalline state.

Next, as depicted in FIG. 6C, the AlN layer 6 in an amorphous state and the SiN layer 12 in an amorphous state in the region where a source electrode is to be formed and the region where a drain electrode is to be formed on the i-GaN layer 5, is removed to expose the i-GaN layer 5 with lithography technique, for example.

In the manner similar to the above-described first embodiment, a source electrode 8 and a drain electrode 9 made of Ti/Al, for example, are then formed with evaporation and lift-off techniques, for example, on the i-GaN layer 5 in the region where a source electrode is to be formed and the region where a drain electrode is to be formed.

Thereafter, an ohmic contact is established in an annealing process in a temperature of about 600° C., for example, in a nitride atmosphere, for example, in the manner similar to the above-described first embodiment.

Next, in the manner similar to the above-described first embodiment, a gate electrode 10 made of Ni/Au, for example, is formed on the AlN layer 7 in a crystalline state in the region where a gate electrode is to be formed, with photolithography, and evaporation and lift-off techniques, for example.

Subsequently, a SiN passivation film 11 is formed over the entire surface with a PECVD technique, for example, in the manner similar to the above-described first embodiment.

Thereafter, in the manner similar to the above-described first embodiment, interconnections for electrodes, i.e., the source electrode 8, the drain electrode 9, and the gate electrode 10, are formed to complete the AlGaN/GaN-HEMT (semiconductor device).

It is to be noted that, since other details are similar to those of the first embodiment described hereinabove, descriptions thereof will be omitted herein.

As described above, similar to the above-described first embodiment, the semiconductor device and the method of the manufacturing the same in accordance with the present embodiment are advantageous in that a higher withstanding voltage and a higher output are achieved, as well as achieving a normally-off operation while reducing the contact resistance.

Particularly, in accordance with the method of manufacturing a semiconductor device of the present embodiment, a device capable of operating in a normally-off operation can be fabricated, without requiring any special processes. More specifically, a device capable of operating in a normally-off operation can be fabricated in a lower cost, since substantially no modification to conventional processes is required.

[Third Embodiment]

Next, a semiconductor device and a method of manufacturing the same in accordance with a third embodiment will be described with reference to FIG. 7.

Figure 7:
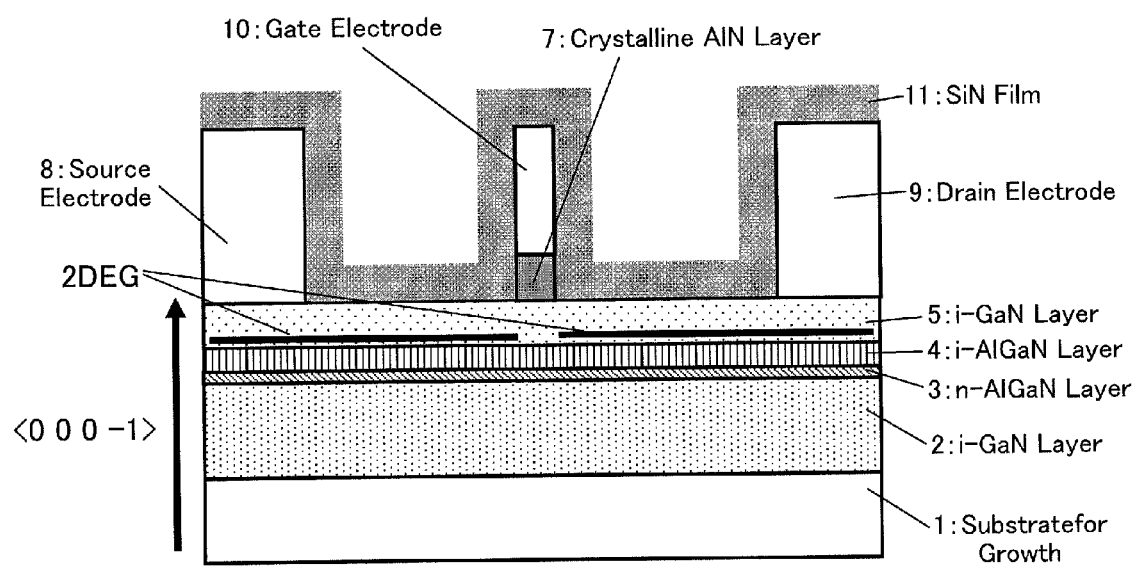
FIG. 7 is a schematic cross-sectional view illustrating the configuration of a semiconductor device in accordance with a third embodiment.

A semiconductor device in accordance with the present embodiment is different from that in the above-described first embodiment in that an amorphous layer covering the surface of the inverted HEMT is omitted, as depicted in FIG. 7. In FIG. 7, the same elements as those in the above-described first embodiment are referenced to by the like reference symbols.

More specifically, in this AlGaN/GaN-HEMT, the surface of an i-GaN layer 5 other than the region directly under a gate electrode 10 is covered with an SiN passivation film 11, not with an amorphous layer.

Next, a method of manufacturing this AlGaN/GaN-HEMT (semiconductor device) will be explained with reference to FIG. 7.

Firstly, in the manner similar to the above-described first embodiment, as depicted in FIG. 7, an inverted HEMT structure including a GaN layer 5 with a nitride-polar surface is formed with an MOCVD, for example, on a sapphire substrate 1 as a substrate for growth.

Next, an AlN layer 7 in a crystalline state is formed in the region only directly under the gate electrode 10 on the i-GaN layer 5 with the nitride-polar surface, with a MOCVD technique, for example.

More specifically, a mask is formed in the region where a gate electrode is to be formed on the i-GaN layer 5, with photolithography technique, and an AlN layer 7 in a crystalline state is formed in the region where a gate electrode is to be formed on the i-GaN layer 5 by adjusting the film formation condition. Note that the AlN layer 7 in a crystalline state is also referred to as a crystalline AlN layer.

Next, after removing the mask, a source electrode 8 and a drain electrode 9 made of Ti/Al, for example, are then formed with evaporation and lift-off techniques, for example, on the i-GaN layer 5 in the region where a source electrode is to be formed and the region where a drain electrode is to be formed.

Thereafter, an ohmic contact is established in an annealing process in a temperature of about 600° C., for example, in a nitride atmosphere, for example, in the manner similar to the above-described first embodiment.

Next, in the manner similar to the above-described first embodiment, a gate electrode 10 made of Ni/Au, for example, is formed on the AlN layer 7 in a crystalline state in the region where a gate electrode is to be formed, with photolithography, and evaporation and lift-off techniques, for example.

Subsequently, a SiN passivation film 11 is formed over the entire surface with a PECVD technique, for example, in the manner similar to the above-described first embodiment.

Thereafter, in the manner similar to the above-described first embodiment, interconnections for electrodes, i.e., the source electrode 8, the drain electrode 9, and the gate electrode 10, are formed to complete the AlGaN/GaN-HEMT (semiconductor device).

It is to be noted that, since other details are similar to those of the first embodiment described hereinabove, descriptions thereof will be omitted herein.

As described above, similar to the above-described first embodiment, the semiconductor device and the method of the manufacturing the same in accordance with the present embodiment are advantageous in that a higher withstanding voltage and a higher output are achieved, as well as achieving a normally-off operation while reducing the contact resistance.

Particularly, in accordance with the method of manufacturing a semiconductor device of the present embodiment, a device capable of operating in a normally-off operation can be fabricated, without requiring any special processes. More specifically, a device capable of operating in a normally-off operation can be fabricated in a lower cost, since substantially no modification to conventional processes is required.

[Fourth Embodiment]

Next, a power supply apparatus in accordance with a fourth embodiment will be described with reference to FIG. 8.

The power supply apparatus in accordance with the present embodiment is a power supply apparatus including any of the semiconductor devices (AlGaN/GaN-HEMTs) according to the first to third embodiments described above.

Figure 8:
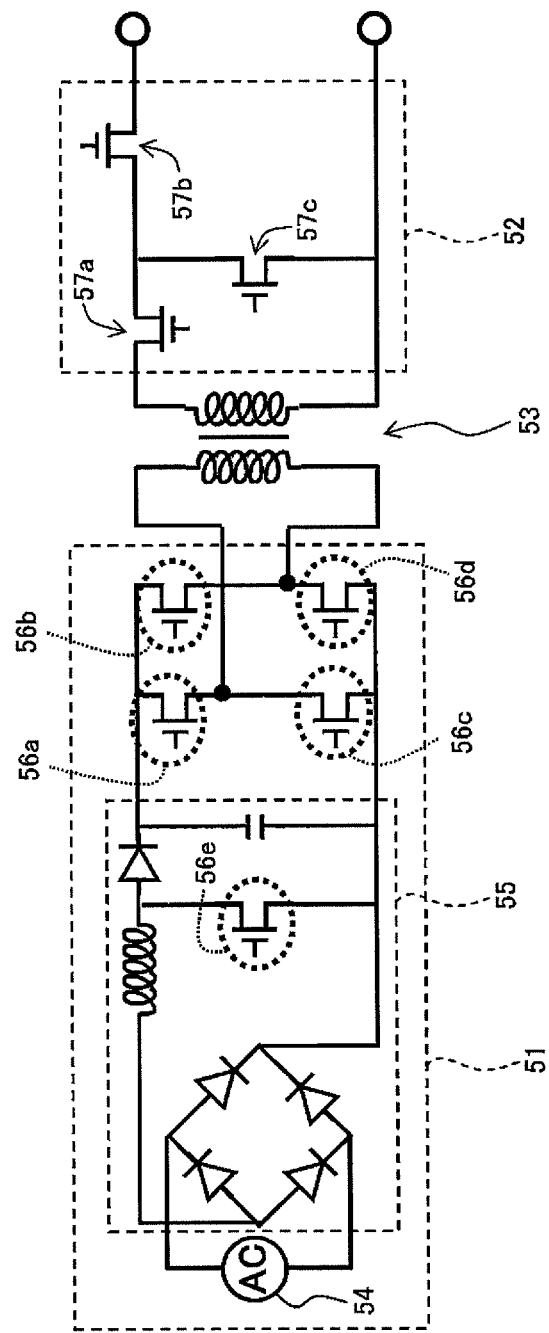
FIG. 8 is a schematic cross-sectional view illustrating the configuration of a power supply apparatus in accordance with a fourth embodiment.

This power supply apparatus includes, as depicted in FIG. 8, a higher-voltage primary circuit (higher-voltage circuit) 51, a lower-voltage secondary circuit (lower-voltage circuit) 52, and a transformer (voltage converter) 53 provided between the primary circuit 51 and the secondary circuit 52.

The primary circuit 51 is configured to include an alternating current power supply 54, a so-called bridge rectifier circuit 55, and a plurality of (four, in this embodiment) switching elements 56a, 56b, 56c, and 56d. The bridge rectifier circuit 55 includes a switching element 56e.

The secondary circuit 52 is configured to include a plurality of (three, in this embodiment) switching elements 57a, 57b, and 57c.

In the present embodiment, the switching elements 56a, 56b, 56c, 56d, and 56e in the primary circuit 51 are configured as an AlGaN/GaN-HEMT of any of the first to third embodiments. In contrast, the switching elements 57a, 57b, and 57c in the secondary circuit 52 are typical silicon-based MISFETs.

Hence, advantageously, since the power supply apparatus in accordance with the present embodiment employs semiconductor devices (AlGaN/GaN-HEMTs) in accordance with the first to third embodiments described above in the higher-voltage circuit, a higher-output power supply apparatus can be achieved. Particularly, since the power supply apparatus in accordance with the present embodiment includes semiconductor devices (AlGaN/GaN-HEMTs) in accordance with the first to third embodiments, a normally-off operation can be achieved, while reducing the contact resistance.

[Miscellaneous]

Note that the present disclosure is not limited to the configurations of the embodiments set forth above, and may be modified in various manners without departing from the sprit of the present disclosure.

First, while an AlN layer 7 in a crystalline state (semiconductor layer) is provided on a GaN layer 5 (first nitride semiconductor layer) and only under a gate electrode 10 in the above-described embodiments, this is not limiting. For example, a semiconductor layer exhibiting a polarization may be provided on a first nitride semiconductor layer and only under a gate electrode. The semiconductor layer exhibiting a polarization suppresses generation of two-dimensional electron gas in the region under a gate electrode, which achieves a normally-off operation.

Here, the semiconductor layer exhibiting a polarization may be preferably a semiconductor layer having a strength of a polarization and a thickness such that generation of two-dimensional electron gas can be suppressed. More specifically, the material, the composition, and the thickness of the semiconductor layer provided only under a gate electrode may be selected such that generation of two-dimensional electron gas is suppressed.

Particularly, a semiconductor layer exhibiting a polarization is preferably a semiconductor layer having a stronger polarization (particularly a strong spontaneous polarization) than that of the first nitride semiconductor layer contacting that semiconductor layer, a semiconductor layer having a greater band gap than that of the first nitride semiconductor layer, or a semiconductor layer having a stronger polarization and having a wider band gap than those of the first nitride semiconductor layer. In such a case, the semiconductor layer can be made thinner.

Here, in the nitride semiconductor, the asymmetry of the atomic structure induces spontaneous polarization, even in the absence of any strain. Hence, negative charges are generated on the (0001) face, while positive charges are generated on the (000-1) face. These charges induce an internal electric field along the c axis.

For example, for an AlGaN/GaN-HEMT including an inverted HEMT structure, the strength of spontaneous polarization in GaN defining the top layer of the inverted HEMT structure is about 3.1 MV/cm. Accordingly, a semiconductor layer having a strength of spontaneous polarization of about 3.1 MV/cm or more is preferably provided on the GaN layer and only under the gate electrode.

Further, the semiconductor layer exhibiting a polarization may be preferably a semiconductor layer having a strength of a polarization and a thickness that can raise the gate threshold voltage to 0 V or higher. More specifically, the material, the composition, and the thickness of the semiconductor layer provided only under a gate electrode may be selected such that the gate threshold voltage is raised to 0 V or higher.

More specifically, the semiconductor layer provided on a first nitride semiconductor layer and only under a gate electrode may be made of a nitride semiconductor material, such as AlGaN, InAlN, InGaN, InN, and AlInGaN, for example, and may be in a crystalline state. In other words, the semiconductor layer provided on a first nitride semiconductor layer and only under a gate electrode may be a nitride semiconductor crystalline layer, such as an AlGaN layer, an InAlN layer, an InGaN layer, an InN layer, and an AlInGaN layer, for example.

Alternatively, the semiconductor layer provided on a first nitride semiconductor layer and only under a gate electrode may be made of an oxide semiconductor material, such as ZnO, for example, and may be in a crystalline state. In other words, the semiconductor layer provided on a first nitride semiconductor layer and only under a gate electrode may be an oxide semiconductor crystalline layer, such as a ZnO layer, for example.

As described above, the semiconductor layer provided on a first nitride semiconductor layer and only under a gate electrode may be a semiconductor crystalline layer including any of AlN, AlGaN, InAlN, InGaN, InN, AlInGaN, and ZnO.

Among these materials, the semiconductor layer provided on a first nitride semiconductor layer and only under a gate electrode is preferably a semiconductor crystalline layer including any of AlN, AlGaN, InAlN, AlInGaN, and ZnO since these materials exhibit spontaneous polarization greater than that of GaN.

Further, the semiconductor layer provided on a first nitride semiconductor layer and only under a gate electrode may be single-layered or multi-layered. For example, an AlN/GaN layer having a multi-layered structure where an AlN layer and a GaN layer are stacked, may be provided, in place of a single AlGaN layer. Such a structure can be regarded as an additional semiconductor layer provided between the semiconductor layer exhibiting a polarization and the gate electrode.

Further, the nitride semiconductor stacked structure forming the AlGaN/GaN-HEMT is not limited to the ones of the above-described embodiments, and may include GaN, AlN, or InN, or any combinations thereof, for example.

Figure 9:
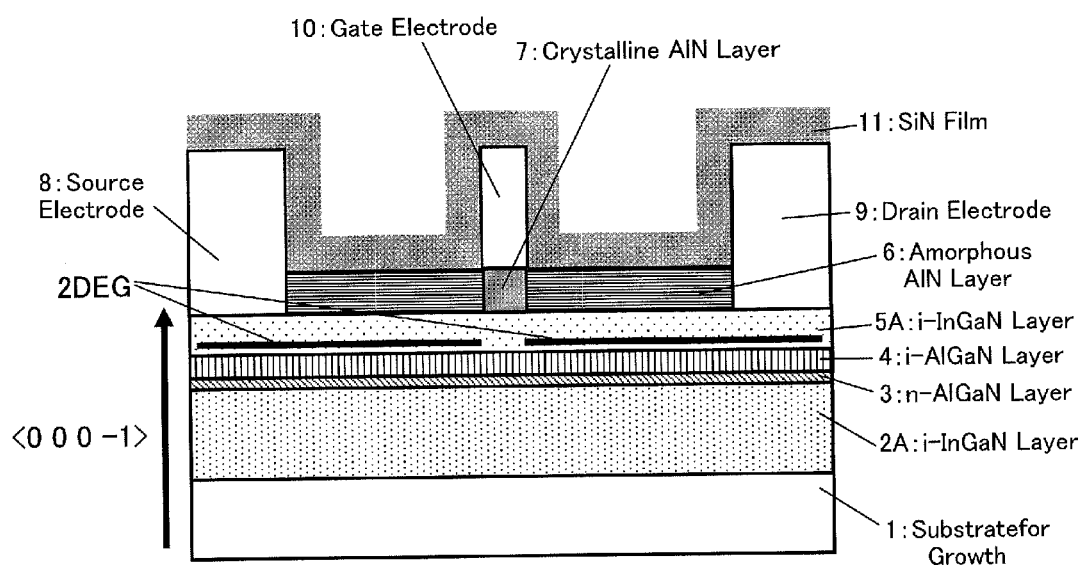
FIG. 9 is a schematic cross-sectional view illustrating the configuration of a semiconductor device in accordance with one variant of the first embodiment.

For example, although an i-GaN layer 5 is used as an electron transit layer (first nitride semiconductor layer) in the above-described embodiments, this is not limiting and an i-InGaN layer 5A as depicted in FIG. 9 may be used, for example. In other words, a first nitride semiconductor layer (electron transit layer) may be any semiconductor layer including GaN or InGaN. In this case, an i-InGaN layer 2A may be preferably used, in place of an i-GaN layer 2 formed on the substrate 1. In FIG. 9, the same elements as those in the above-described first embodiment are referenced to by the like reference symbols.

Further, although an AlN layer in an amorphous state is used as the amorphous layer in the above-described first embodiment, and an SiN layer in an amorphous state is used as the first amorphous layer and an AlN layer in an amorphous state is used as the second amorphous layer in the above-described second embodiment, this is not limiting. The amorphous layer, the first amorphous layer, and the second amorphous layer may be any layers including amorphous materials. For example, the amorphous layer, the first amorphous layer, and the second amorphous layer may be any layers including nitride-based amorphous materials.

Figure 10:
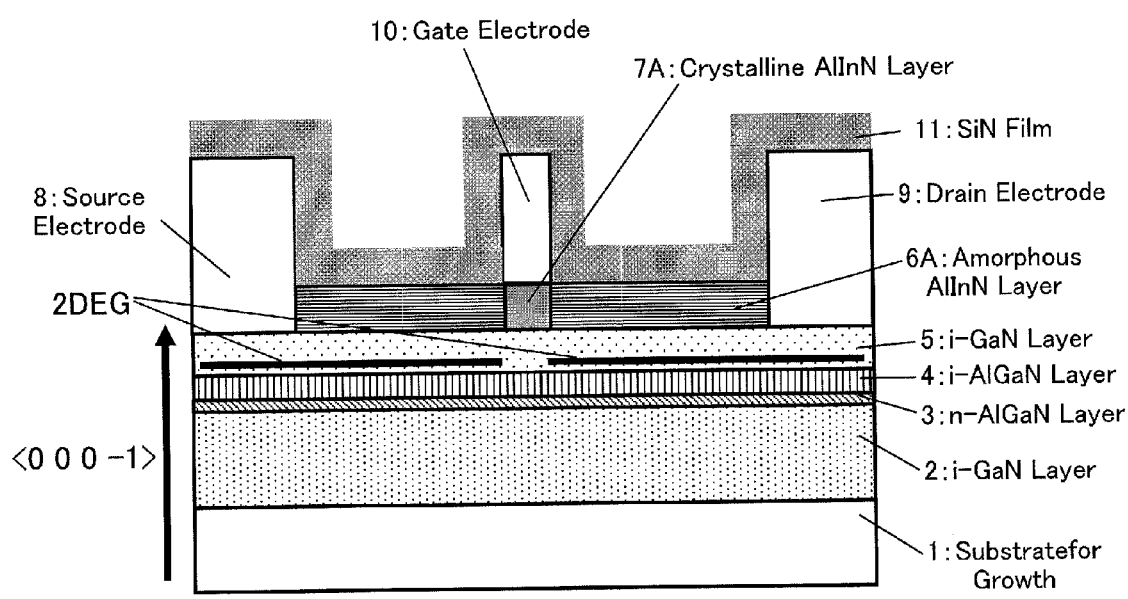
FIG. 10 is a schematic cross-sectional view illustrating the configuration of a semiconductor device in accordance with another variant of the first embodiment.

For example, as depicted in FIG. 10, when an InAlN layer 7A in a crystalline state is used, as semiconductor layer, in place of the AlN layer 7 in a crystalline state in the above-described first embodiment, an InAlN layer 6A in an amorphous state may be used, as amorphous layer, in place of the AlN layer 6 in an amorphous state.

Generally stated, when a semiconductor crystalline layer including any of AlGaN, InAlN, InGaN, InN, AlInGaN, and ZnO is used, as the semiconductor layer, in place of the AlN layer 7 in a crystalline state, in the above-described first embodiment, a semiconductor amorphous layer including the any of AlGaN, InAlN, InGaN, InN, AlInGaN, and ZnO may be used, as the first amorphous layer, in place of the AlN layer 6 in an amorphous state. In other words, a semiconductor layer in an amorphous state including the same semiconductor material as the semiconductor layer in a crystalline state used for the semiconductor layer provided on a first nitride semiconductor layer and only under a gate electrode may be used as the amorphous layer.

Further, when a semiconductor crystalline layer including any of AlGaN, InAlN, InGaN, InN, AlInGaN, and ZnO is used, as the semiconductor layer, in place of the AlN layer 7 in a crystalline state, in the above-described second embodiment, a semiconductor amorphous layer including the any of AlGaN, InAlN, InGaN, InN, AlInGaN, and ZnO may be used, as the second amorphous layer, in place of the AlN layer 6 in an amorphous state. In other words, a semiconductor layer in an amorphous state including the same semiconductor material as the semiconductor layer in a crystalline state used for the semiconductor layer provided on a first nitride semiconductor layer and only under a gate electrode may be used as the second amorphous layer.

All examples and conditional language provided herein are intended for pedagogical purposes to aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiment(s) of the present invention have been described in detail, it should be understood that the various changes, substitutions, and alterations could be made hereto without departing from the spirit and scope of the invention.

What is claimed is:

1. A semiconductor device, comprising:
a substrate;
a first nitride semiconductor layer provided over the substrate and having a nitride-polar surface;

a gate electrode provided over the first nitride semiconductor layer;
a semiconductor layer in a crystalline state, provided on the first nitride semiconductor layer and only under the gate electrode, and exhibiting a polarization suppressing generation of two-dimensional electron gas; and
a first amorphous layer covering a surface of the first nitride semiconductor layer other than under the gate electrode and not exhibiting a polarization suppressing generation of two-dimensional electron gas,
wherein the semiconductor layer in the crystalline state and the first amorphous layer include a same semiconductor material.

2. The semiconductor device in accordance with claim 1, wherein the semiconductor layer in the crystalline state is a nitride semiconductor layer in a crystalline state or an oxide semiconductor layer in a crystalline state.

3. The semiconductor device in accordance with claim 1, wherein the first nitride semiconductor layer includes GaN or InGaN, and
the semiconductor layer in the crystalline state is a semiconductor layer in a crystalline state including any of AlN, AlGaN, InAlN, InGaN, InN, AlInGaN, and ZnO.

4. The semiconductor device in accordance with claim 1, further comprising a second nitride semiconductor layer contacting a bottom of the first nitride semiconductor layer and having a nitride-polar surface.

5. The semiconductor device in accordance with claim 4, wherein the second nitride semiconductor layer includes AlGaN.

6. A power supply apparatus, comprising:
voltage converter; and
a higher-voltage circuit and a lower-voltage circuit provided on opposite sides of the voltage converter, sandwiching the voltage converter therebetween,
wherein the higher-voltage circuit includes a transistor, and the transistor includes:
a substrate;
a first nitride semiconductor layer provided over the substrate and having a nitride-polar surface;
a gate electrode provided over the first nitride semiconductor layer; and
a semiconductor layer in a crystalline state, provided on the first nitride semiconductor layer and only under the gate electrode, and exhibiting a polarization suppressing generation of two-dimensional electron gas; and
a first amorphous layer covering a surface of the first nitride semiconductor layer other than under the gate electrode and not exhibiting a polarization suppressing generation of two-dimensional electron gas,
wherein the semiconductor layer in the crystalline state and the first amorphous layer include a same semiconductor material.

7. A semiconductor device, comprising:
a substrate;
a first nitride semiconductor layer provided over the substrate and having a nitride-polar surface;
a gate electrode provided over the first nitride semiconductor layer;
a semiconductor layer in a crystalline state, provided on the first nitride semiconductor layer and only under the gate electrode, and exhibiting a polarization suppressing generation of two-dimensional electron gas;
a first amorphous layer covering a surface of the first nitride semiconductor layer other than under the gate electrode and not exhibiting a polarization suppressing generation of two-dimensional electron gas; and
a second amorphous layer provided on the first amorphous layer,
wherein the semiconductor layer in the crystalline state and the second amorphous layer include a same semiconductor material, and
the first amorphous layer and the second amorphous layer include different materials.

8. The semiconductor device in accordance with claim 7, wherein the first amorphous layer includes SiN.

9. A method of manufacturing a semiconductor device, comprising:
forming a first nitride semiconductor layer with a nitride-polar surface, over a substrate;
forming a semiconductor layer exhibiting a polarization suppressing generation of two-dimensional electron gas, in a region where a gate electrode is to be formed on the first nitride semiconductor layer; and
forming a gate electrode over the semiconductor layer,
wherein the forming the semiconductor layer includes:
forming an amorphous layer not exhibiting a polarization suppressing generation of two-dimensional electron gas on an entire surface of the first nitride semiconductor layer; and
forming the semiconductor layer by crystallizing the amorphous layer formed in the region where a gate electrode is to be formed on the first nitride semiconductor layer.

10. The method of manufacturing a semiconductor device in accordance with claim 9, wherein the semiconductor layer is a nitride semiconductor crystalline layer or an oxide semiconductor crystalline layer.

11. The method of manufacturing a semiconductor device in accordance with claim 9, wherein
the first nitride semiconductor layer is a GaN layer or an InGaN layer, and
the semiconductor layer is a semiconductor crystalline layer including any of AlN, AlGaN, InAlN, InGaN, InN, AlInGaN, and ZnO.

12. The method of manufacturing a semiconductor device in accordance with claim 9, further comprising removing the amorphous layer formed in a region where a source electrode is to be formed and a region where a drain electrode is to be formed on the first nitride semiconductor layer, and forming a source electrode and a drain electrode on the first nitride semiconductor layer.

13. The method of manufacturing a semiconductor device in accordance with claim 9, further comprising:
forming a second nitride semiconductor layer with a nitride-polar surface, over the substrate; and
forming a first nitride semiconductor layer over the second nitride semiconductor layer.

14. The method of manufacturing a semiconductor device in accordance with claim 13, wherein the second amorphous layer is an AlGaN layer.

15. A method of manufacturing a semiconductor device comprising:
forming a first nitride semiconductor layer with a nitride-polar surface, over a substrate;
forming a semiconductor layer in a crystalline state exhibiting a polarization suppressing generation of two-dimensional electron gas, in a region where a gate electrode is to be formed on the first nitride semiconductor layer; and
forming a gate electrode over the semiconductor layer in the crystalline state, wherein the forming the semiconductor layer in the crystalline state includes:
forming a first amorphous layer not exhibiting a polarization suppressing generation of two-dimensional electron gas in a region other than the region where a gate electrode is to be formed on the first nitride semiconductor layer; and
forming the semiconductor layer in the crystalline state, in the region where a gate electrode is to be formed on the first nitride semiconductor layer, together with forming, on the first amorphous layer, a second amorphous layer including a material different from a material of the first amorphous layer and including the same semiconductor material as the semiconductor layer in the crystalline state.

16. The method of manufacturing a semiconductor device in accordance with claim 15, wherein the first amorphous layer is an SiN layer.

17. The method of manufacturing a semiconductor device in accordance with claim 15, further comprising:
removing the first amorphous layer and the second amorphous layer formed in a region where a source electrode is to be formed and a region where a drain electrode is to be formed on the first nitride semiconductor layer, and forming a source electrode and a drain electrode on the first nitride semiconductor layer.

18. The method of manufacturing a semiconductor device in accordance with claim 15, wherein the semiconductor layer in the crystalline state is a nitride semiconductor layer in a crystalline state or an oxide semiconductor layer in a crystalline state.

19. The method of manufacturing a semiconductor device in accordance with claim 15, wherein
the first nitride semiconductor layer is a GaN layer or an InGaN layer, and
the semiconductor layer in the crystalline state is a semiconductor layer in a crystalline state including any of AlN, AlGaN, InAlN, InGaN, InN, AlInGaN, and ZnO.

* * * * *